(12) United States Patent
Li et al.

(10) Patent No.: US 6,819,144 B2
(45) Date of Patent: Nov. 16, 2004

(54) LATCHED SENSE AMPLIFIER WITH FULL RANGE DIFFERENTIAL INPUT VOLTAGE

(75) Inventors: Kun-Hsi Li, Plano, TX (US); Bryan D. Sheffield, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/383,076

(22) Filed: Mar. 6, 2003

(65) Prior Publication Data

US 2004/0174190 A1 Sep. 9, 2004

(51) Int. Cl.$^7$ ............................................... G01R 19/00
(52) U.S. Cl. ............................ 327/55; 327/57; 327/215
(58) Field of Search .......................... 327/52, 55–57, 327/199, 200, 210–212, 215, 225; 365/227

(56) References Cited

U.S. PATENT DOCUMENTS

| | | | |
|---|---|---|---|
| 4,169,233 A | * | 9/1979 | Haraszti ........................ 327/57 |
| 4,558,241 A | * | 12/1985 | Suzuki et al. .................. 327/57 |
| 5,796,273 A | | 8/1998 | Jung et al. |
| 5,949,256 A | * | 9/1999 | Zhang et al. .................. 327/57 |
| 5,963,060 A | * | 10/1999 | Varadarajan et al. .......... 327/55 |
| 6,008,673 A | * | 12/1999 | Glass et al. .................... 327/77 |
| 6,384,664 B1 | | 5/2002 | Hellums et al. |
| 6,456,121 B2 | | 9/2002 | Zhang |
| 6,584,026 B2 | * | 6/2003 | Kawasumi ................... 365/205 |

* cited by examiner

Primary Examiner—Kenneth B. Wells
(74) Attorney, Agent, or Firm—Alan K. Stewart; W. James Brady, III; Frederick J. Telecky, Jr.

(57) ABSTRACT

A sense amplifier that is capable of sensing small differential voltage between two inputs with full voltage range includes a first inverter 305 and 306; a second inverter 307 and 308 cross coupled with the first inverter; a first transmission gate 301 coupled between a reference node REF and an input of the first inverter; a second transmission gate 302 coupled between a data node RD and an input of the second inverter; a pull-up enable switch 303 coupled between a high side voltage source node VDD, and the first and second inverters; and a pull-down enable switch 304 coupled between a low side voltage source node, and the first and second inverters.

10 Claims, 3 Drawing Sheets

LATCHED SENSE AMPLIFIER WITH FULL RANGE DIFFERENTIAL INPUT VOLTAGE

FIELD OF THE INVENTION

This invention generally relates to electronic systems and in particular it relates sense amplifiers that are capable of sensing small differential voltages between two inputs with full voltage range.

BACKGROUND OF THE INVENTION

The typical prior art sense amplifier is capable of detecting a small differential voltage between two inputs close to the source voltage (VDD). It is widely used in memory with bitlines pre-charged to voltage VDD. However, this type of sense amplifier cannot sense the differential voltage between two inputs that are both below Vtn (the threshold voltage of an NMOS transistor).

One prior art sense amplifier that is capable of sensing a small differential voltage between two inputs REF and DATA close to 0V is shown in FIG. 1. This circuit has output signals OUT and OUT#, clock signal CLK, and enable signal EN. This prior art between two inputs that are both above voltage VDD minus Vtp (the threshold voltage of a PMOS transistor).

FIG. 2 illustrates another prior art sense amplifier that has a wide input range. However, it does not work in low power supply application (sub 1V). After equalization, the voltage at node N10 and the voltage at node N20 are at an intermediate level between the power supply voltage level VDD and ground level. This circuit can not sense differential voltages between nodes REF and DATA if (VN10/VN20−Vtp)<VREF/VDATA<Vtn, where VN10 is the voltage at node N10, VN20 is the voltage at node N20, VREF is the voltage at node REF, and VDATA is the voltage at node DATA. The outputs of this circuit are nodes OUTPUT and OUTPUT#. An enable signal is applied at node EN.

FIG. 3 illustrates a prior art differential voltage sense circuit to detect the state of a CMOS process compatible fuse $R_{FUSE}$. It also cannot sense the differential voltages between two input signals that are both below Vtn.

SUMMARY OF THE INVENTION

A sense amplifier that is capable of sensing small differential voltage between two inputs with full voltage range includes a first inverter; a second inverter cross coupled with first inverter; a first transmission gate coupled between a reference node and an input of the first inverter; a second transmission gate coupled between a data node and an input of the second inverter; a pull-up enable switch coupled between a high side voltage source node, and the first and second inverters; and a pull-down enable switch coupled between a low side voltage source node, and the first and second inverters.

DESCRIPTION OF PREFERRED EMBODIMENTS

Figure 1:
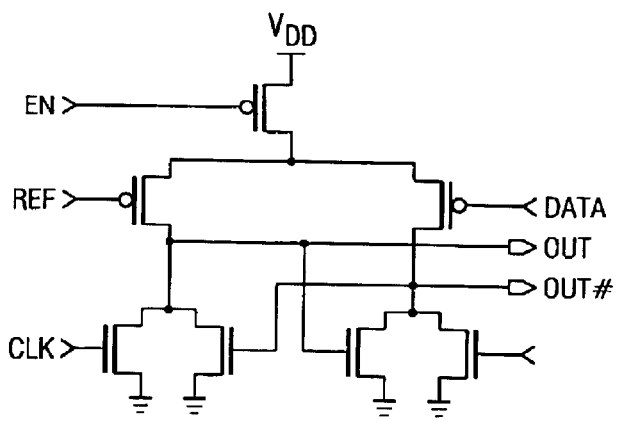
FIG. 1 is a schematic diagram of a prior art sense amplifier for integrated circuits using PMOS transistors.
Figure 2:
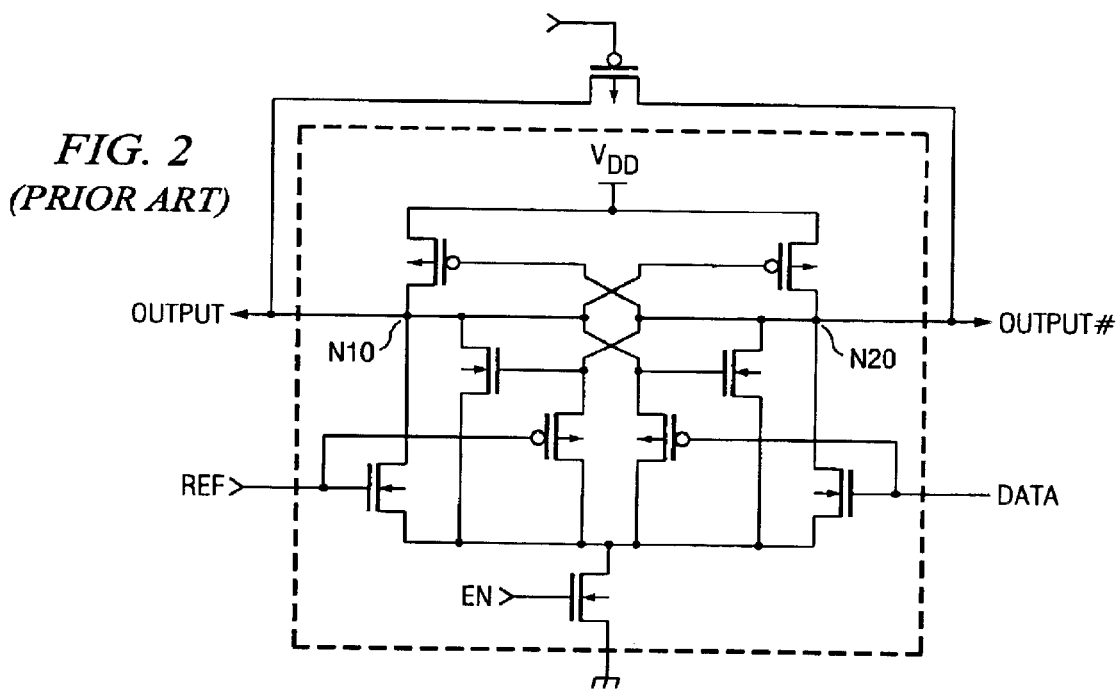
FIG. 2 is a schematic diagram of a prior art sense amplifier for semiconductor memory devices.
Figure 3:
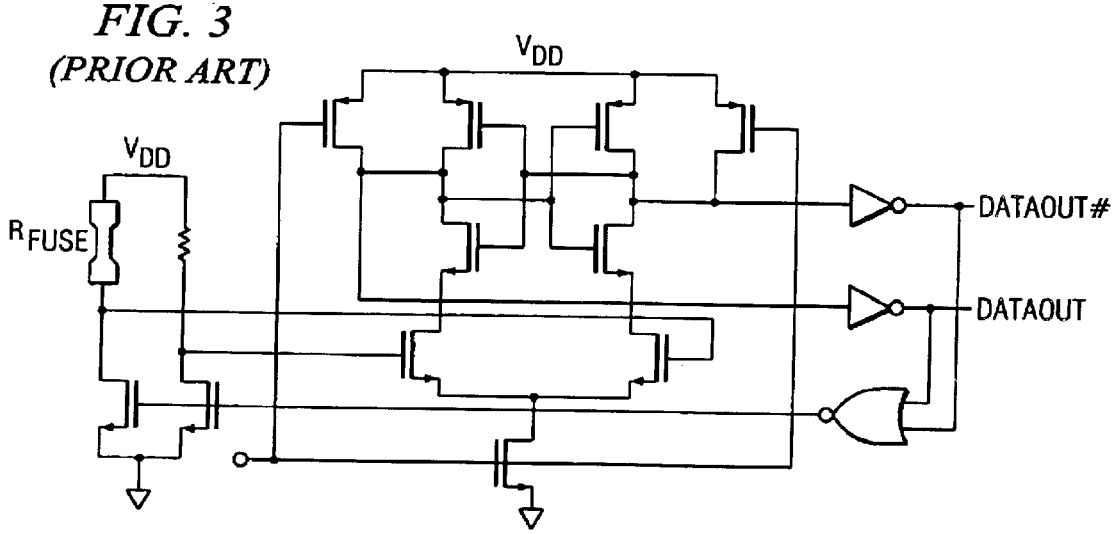
FIG. 3 is a schematic diagram of a prior art differential voltage sense circuit for detecting the state of a CMOS process compatible fuse.
Figure 4:
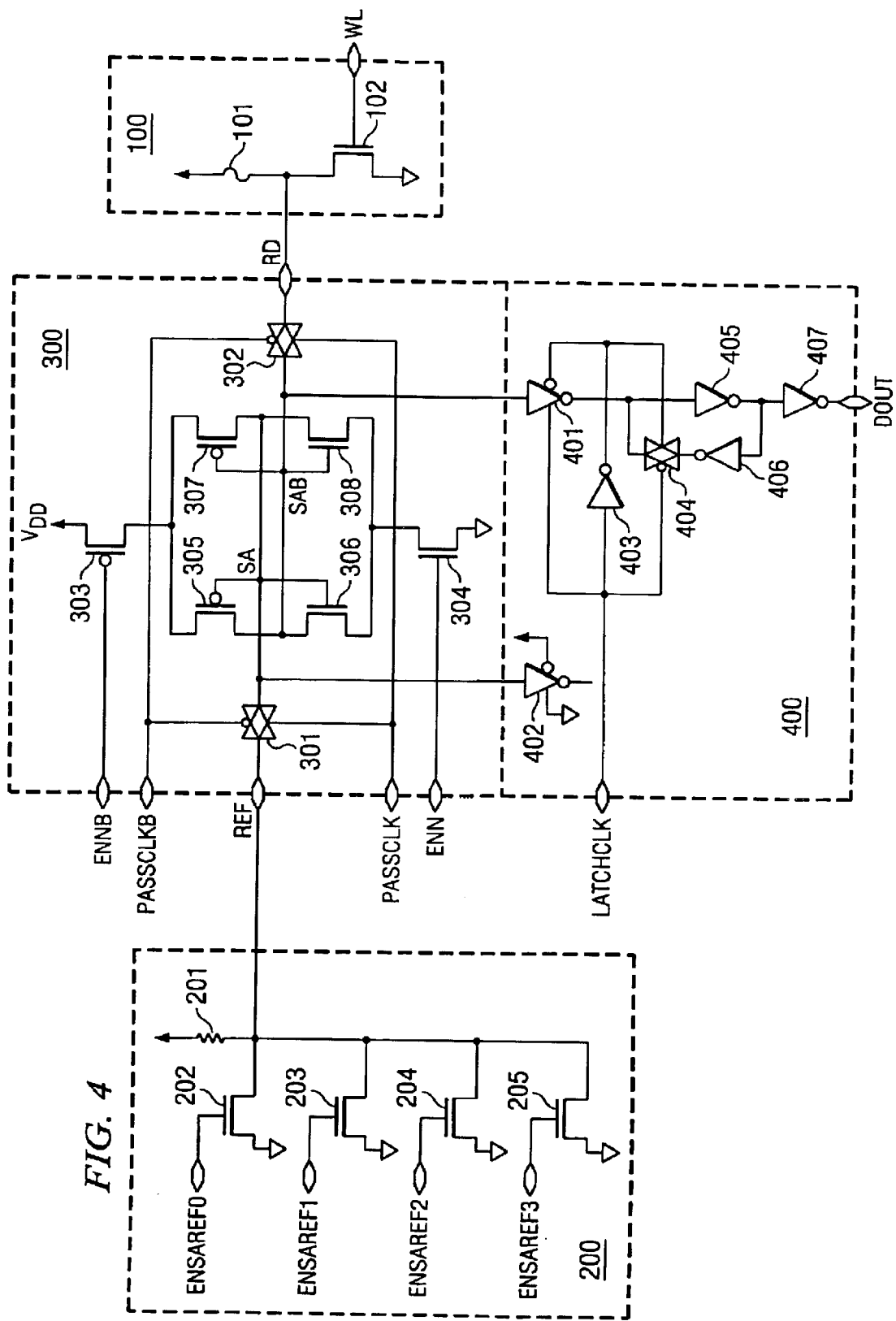
FIG. 4. is a schematic diagram of a preferred embodiment sense amplifier with full range input.

The preferred embodiment circuit shown in FIG. 4 includes fusecell circuit 100 which includes fuse 101, transistor 102, and word line control node WL; reference circuit 200 which includes reference resistor 201, transistors 202–205, and reference control nodes ENSAREF0, ENSAREF1, ENSAREF2, and ENSAREF3; sense amplifier circuit 300 which includes two CMOS transmission gates 301 and 302, pull-up enable PMOS 303, pull-down enable NMOS 304, two cross-coupled inverters formed by PMOS transistors 305 and 307 and NMOS transistors 306 and 308, enable nodes ENN and ENNB, clock nodes PASSCLK and PASSCLKB, reference node REF, and data node RD; and output latch circuit 400 which includes a pair of tri-state inverters 401 and 402, inverter 403, transmission gate 404, inverters 405–407, clock signal LATCHCLK, and output DOUT.

The preferred embodiment sense amplifier of FIG. 4 is designed to detect the differential voltage between a fuse bitcell and a reference voltage. This sense amplifier can be used to detect the state of a CMOS process compatible (e.g. poly, metal) fuse in a programmable fuse array. In the early fuse development process, the tail distribution of blown fuses can be on the order of tens of $K_\Omega$. To allow the fuse to be electrically programmed in the package, the program current needs to be limited so the post-blown resistance will not be on the order of $M_\Omega$. A multiple reference voltage setting is implemented in programmable fuse arrays to determine the resistance range of the fuse. To achieve this requirement, the sense amplifier must be capable of detecting small differential voltages between two input signals ranging from ground (0V) to VDD.

The fusecell circuit 100 comprises fuse 101 and NMOS transistor 102 with word line control. When wordline WL is ON, the circuit 100 acts as a voltage divider.

$$V_{RD} = R_{102}/(R_{101}+R_{102}) * VDD$$

$V_{RD}$ is the voltage at node RD. $R_{101}$ is the resistance of the fuse 101. $R_{102}$ is the effective resistance of NMOS transistor 102.

The resistance of a silicide poly fuse 101, for example, is in the range of about 30–100 $_\Omega$ if not blown. Depending on the process in which the fuse is blown, the resistance can be from about the order of $K_\Omega$ to $M_\Omega$ when it is blown. The voltage $V_{RD}$ can range from 0 to VDD.

The reference circuit 200 comprises a reference resistor 201 and NMOS transistors 202, 203, 204, and 205. The reference resistance 201 is about 2000 $_\Omega$. The voltage of node REF is set by the activation of nodes ENSAREF0, ENSAREF1, ENSAREF2, and ENSAREF3. Four reference voltage settings are available from circuit 200. These four modes are referred to as MARGIN0, NORMAL, MARGIN1A, and MARGIN1B.

MARGIN0 mode is used to screen the un-blown fuses. NORMAL mode is used for normal fuse detection in production. MARGIN1A and MARGIN1B are used to screen the partially blown fuses.

To fully utilize the full voltage range, the voltage at node REF is above VDD−Vtp for MAGIN0 and the voltage at node REF for MARGIN1A and MARGIN1B is below Vtn.

In order to implement the four reference modes and detect the marginal un-blown and blown fuses, a sense amplifier that allows the full range (0 to VDD) input voltage is needed.

The circuit 300 comprises two CMOS transmission gates 301 and 302, pull-up enable PMOS transistor 303, pull-down enable NMOS transistor 304, and two cross-coupled inverters formed by PMOS transistors 305 and 307, and NMOS transistors 306 and 308.

The input nodes RD and REF of sense amplifier 300 are connected to fusecell 100 and reference circuit 200, respectively. The transmission gates 301 and 302 are controlled by clock signals PASSCLK/PASSCLKB. Clock signal PASSCLKB is the inverted signal of clock signal PASSCLK.

The pull-up PMOS transistor 303 and pull-down NMOS transistor 304 are controlled by enable signals ENNB and ENN, respectively. Enable signal ENNB is the inverted signal of enable signal ENN. The transmission gates 301 and 302 are ON and pull-up PMOS 303/pull-down NMOS 304 are OFF to allow nodes SA and SAB to be charged to the level of nodes REF and RD before the sense operation.

The transmission gates 301 and 302 are switched OFF before the pull-up PMOS 303 and pull-down NMOS 304 are turned ON to start the sense operation.

Because one reference circuit is connected to multiple sense amplifiers, the transmission gate 301 is required to isolate the node SA from reference circuit 200 during sense operation.

The sensing operation is enabled by turning on the enable transistors 303 and 304 that are controlled by nodes ENNB and ENN, respectively.

The pull-up PMOS 303 is turned ON with the falling transition of the enable signal at node ENNB. The NMOS pull-down NMOS is turned ON with the rising transition of the enable signal at node ENN.

With the transmission gates 301 and 302 in the OFF state, the nodes SA and SAB in sense amplifier 300 are isolated from capacitance in reference circuit 200 and bitline of fusecell 100 during sense operation. Because of this isolation and infinite gain (positive feedback, from the cross-coupled inverters, the internal nodes SA and SAB can be pulled apart to VDD and 0V in less than 500 ps with 50 mv differential at normal voltage/process.

If both input signals REF and RD are below Vtn ($V_{RD} < V_{REF} < Vtn$) where $V_{REF}$ is the voltage at node REF, the differential voltage is initially amplified by PMOS transistors 305 and 307. When node ENN transits to high and node ENNB transits to low, NMOS transistors 306 and 308 are OFF and PMOS transistors 305 and 307 are ON. The gate-to-source voltage (Vgs) of PMOS transistor 307 is larger than the Vgs of PMOS transistor 305. The PMOS transistor 307 current is larger than PMOS transistor 305 current, so node SA is pulled up faster than node SAB (differential voltage is amplified). When node SA is pulled above Vtn of NMOS 306, NMOS 306 is turned ON and pulls down node SAB. This causes more separation between nodes SA and SAB. Node SA is eventually pulled up to VDD through PMOS transistors 303 and 307 and node SAB is pulled down to 0V tnrough NMOS transistors 304 and 306 with NMOS 308 and PMOS 305 in the OFF state. The timing diagram is shown on FIG. 5.

If both input signals at nodes REF and RD are above VDD−Vtp (VDD>$V_{RD}$>$V_{REF}$>VDD−Vtp), the differential voltage is initially amplified by NMOS transistors 306 and 308. When ENN transits to high and ENNB transits to low, NMOS transistors 306, and 308 are ON and PMOS transistors 305 and 307 are OFF. The gate-to-source voltage (Vgs) of NMOS transistor 308 is larger than the Vgs of NMOS transistor 306. The current in NMOS transistor 308 is larger than the current in NMOS transistor 306, so node SA is pulled down faster than node SAB (differential voltage is amplified). When node SA is pulled below VDD−Vtp, PMOS transistor 305 is turned ON and pulls up node SAB. This causes more separation between SA and SAB. Node SA is eventually pulled down to 0V through NMOS transistors 304 and 308 and node SAB is pulled up to VDD through PMOS transistors 303 and 305 with NMOS transistor 306 and PMOS transistor 307 in the OFF state. The timing diagram is shown on FIG. 6.

The circuit 400 is the output latch circuit for the sense amplifier 300. Tri-state inverters 401 and 402 are connected to nodes SAB and SA in sense amplifier 300. For this embodiment, tri-state inverter 402 is added to balance the loading between nodes SA and SAB. The tri-state inverter 401 is OFF when the signal LATCHCLK is low. After the differential voltage is amplified, the signal LATCHCLK is pulsed high to turn ON tri-state inverter 401, turn OFF transmission gate 404, and allow the signal at node SAB to pass to node DOUR. When the signal LATCHCLK goes low, the tri-state inverter 401 is OFF and transmission gate 404 is ON, so the output remains unchanged regardless of the state of node SAB.

Figure 5:
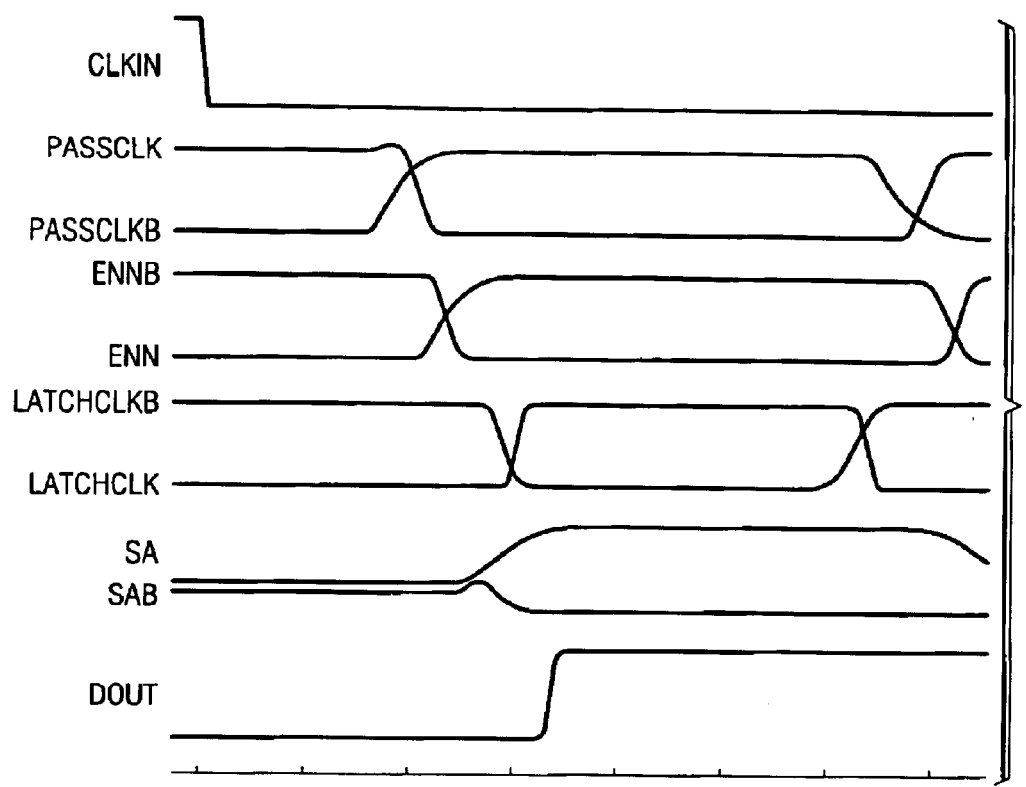
FIG. 5. is a simulation waveform of the circuit of FIG. 4 with both inputs below Vtn.
Figure 6:
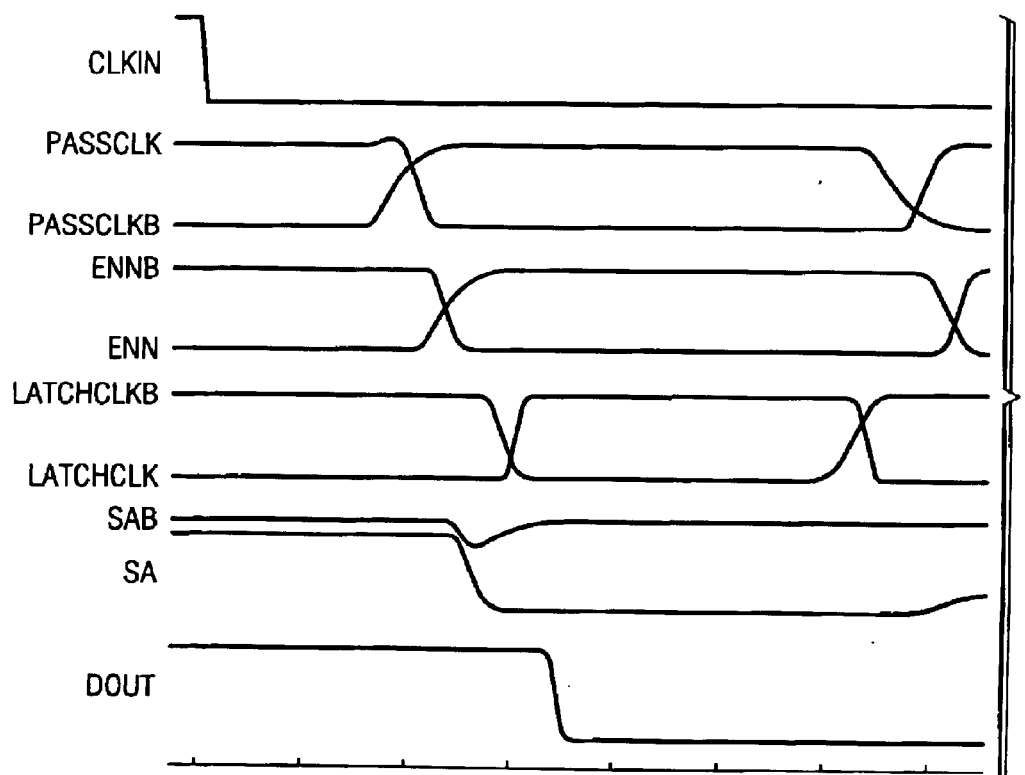
FIG. 6. is a simulation waveform of the circuit of FIG. 4 with both inputs above VDD−Vtp.

The signals PASSCLK, PASSCLKB, ENN, ENNB, and LATCHCLK, are all internally self-timed by input clock signal CLKIN. The timing relations among them are shown in FIG. 5 and FIG. 6.

Most prior art sense amplifiers have the differential inputs limited to the levels close to ground (0V) or VDD. This invention allows a differential input voltage from 0 to VDD. A combination of the reference circuit with multiple margin setting and this sense amplifier invention allows the screening of partial blown fuses.

In order to detect the small differential signals ranging from ground (0V) to VDD, both NMOS and PMOS enable transistors 303 and 304 are used to activate the sense amplifier 300 and CMOS transmission gates 301 and 302 are used to pass bitline voltage to the sense amplifier 300.

The operation of the present sense amplifier is activated by the PMOS and NMOS enable transistors 303 and 304, which allows the circuit to detect small differential signals close to ground (0V) and VDD, respectively. The CMOS transmission gate 302 between bitlines and sense amplifier is used to pass the full-ranged bitline voltage to the sense amplifier without threshold voltage (Vt) drop. The CMOS transmission gate 301 is also shut off prior to the activation of the sense amplifier to allow the common reference voltage for multiple sense amplifiers.

This allows the sense amplifier to detect differential input signals ranging from 0 to VDD. The bitline voltage on the EFUSE ROM 201 can range from 0V to VDD depending on fuse resistance.

The reference circuit 200 with multiple margin setting and this sense amplifier allows the screening of a partial blown fuse.

The preferred embodiment provides a differential voltage sense circuit that has virtually infinite gain (due to positive feedback) and works at low power supply voltage (sub 1V).

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
   a first inverter;
   a second inverter cross-coupled with the first inverter;
   a first transmission gate coupled between a reference node and an input of the first inverter;
   a second transmission gate coupled between a data node and an input of the second inverter;
   a pull-up enable switch coupled between a high side voltage source node, and the first and second inverters;
   a pull-down enable switch coupled between a low side voltage source node, and the first and second inverters; and
   a fusecell circuit coupled to the data node; and
   a multi-mode reference circuit coupled to the reference node.

2. The circuit of claim 1 wherein the reference circuit is a four-mode reference circuit.

3. The circuit of claim 1 further comprising a latch circuit coupled to an output of the first inverter.

4. The circuit of claim 1 wherein the pull-up enable switch is a PMOS transistor.

5. The circuit of claim 1 wherein the pull-down enable switch is an NMOS transistor.

6. The circuit of claim 1 wherein the first inverter comprises a PMOS transistor and an NMOS transistor.

7. The circuit of claim 1 wherein the second inverters comprises a PMOS transistor and an NMOS transistor.

8. The circuit of claim 1 wherein the fusecell circuit comprises:
   a fuse coupled to the data node; and
   a switch coupled to the data node.

9. The circuit of claim 8 wherein the fuse is a silicide poly fuse.

10. The circuit of claim 8 wherein the switch is a transistor having a control node coupled to a wordline.

* * * * *